(12) United States Patent
Wang et al.

(10) Patent No.: US 11,651,615 B2
(45) Date of Patent: May 16, 2023

(54) FINGERPRINT IDENTIFICATION PANEL, FINGERPRINT IDENTIFICATION METHOD AND FINGERPRINT IDENTIFICATION DEVICE

(71) Applicant: BOE TECHNOLOGY GROUP CO., LTD., Beijing (CN)

(72) Inventors: Lei Wang, Beijing (CN); Haisheng Wang, Beijing (CN); Yingming Liu, Beijing (CN); Xiaoliang Ding, Beijing (CN); Lijun Zhao, Beijing (CN); Yuzhen Guo, Beijing (CN); Xiaoquan Hai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 217 days.

(21) Appl. No.: 16/646,434

(22) PCT Filed: Aug. 9, 2019

(86) PCT No.: PCT/CN2019/100035
§ 371 (c)(1),
(2) Date: Mar. 11, 2020

(87) PCT Pub. No.: WO2020/030130
PCT Pub. Date: Feb. 13, 2020

(65) Prior Publication Data
US 2020/0279091 A1   Sep. 3, 2020

(30) Foreign Application Priority Data

Aug. 10, 2018   (CN) .......................... 201810909642.1

(51) Int. Cl.
*G06V 40/13* (2022.01)
*H01L 27/32* (2006.01)
(Continued)

(52) U.S. Cl.
CPC ...... *G06V 40/1318* (2022.01); *H01L 27/3234* (2013.01); *H01L 27/3244* (2013.01);
(Continued)

(58) Field of Classification Search
CPC .............. G06K 9/0004; G06K 9/00013; H01L 27/3227; H01L 27/3225; H01L 27/3234
See application file for complete search history.

(56) References Cited

U.S. PATENT DOCUMENTS

2016/0025855 A1   1/2016   Camarri et al.
2017/0316248 A1*  11/2017  He ..................... G06K 9/00013
(Continued)

FOREIGN PATENT DOCUMENTS

CN   106886767 A   6/2017
CN   107045628 A   8/2017
(Continued)

OTHER PUBLICATIONS

First Office Action dated Dec. 22, 2021 for application No. CN201810909642.1 with English translation attached.
(Continued)

*Primary Examiner* — Yuzhen Shen
(74) *Attorney, Agent, or Firm* — Nath, Goldberg & Meyer; Joshua B. Goldberg

(57) ABSTRACT

The disclosure provides a fingerprint identification panel. The fingerprint identification panel includes an encapsulation layer, a light emitting element, a light sensing element and a dielectric layer. The light emitting element and the light sensing element are on a same side of the encapsulation layer, and the encapsulation layer is configured to enable light emitted from the light emitting element to be totally reflected in the encapsulation layer; the dielectric layer is between the encapsulation layer and the light sensing element and in direct contact with the encapsulation layer, and
(Continued)

is configured to enable the light totally reflected by the encapsulation layer to be received by the light sensing element after passing through the dielectric layer, and a refractive index of the dielectric layer is smaller than that of the encapsulation layer.

15 Claims, 5 Drawing Sheets

(51) Int. Cl.
*H01L 51/52* (2006.01)
*H01L 51/56* (2006.01)
*H01L 27/146* (2006.01)

(52) U.S. Cl.
CPC ...... *H01L 51/5253* (2013.01); *H01L 51/5275* (2013.01); *H01L 51/56* (2013.01); *H01L 27/14678* (2013.01); *H01L 2227/323* (2013.01)

(56) References Cited

U.S. PATENT DOCUMENTS

| | | | |
|---|---|---|---|
| 2017/0372114 A1* | 12/2017 | Cho | G06F 1/1626 |
| 2018/0019288 A1* | 1/2018 | Yang | G06F 3/0412 |
| 2018/0041672 A1* | 2/2018 | Yu | G02B 6/0088 |
| 2018/0074627 A1* | 3/2018 | Kong | G06K 9/00013 |
| 2018/0075278 A1* | 3/2018 | Zhang | G06V 10/147 |
| 2018/0150671 A1 | 5/2018 | Choo et al. | |
| 2018/0349669 A1* | 12/2018 | Kim | G06V 40/1318 |
| 2019/0011954 A1* | 1/2019 | Chu | B32B 7/12 |
| 2019/0057660 A1* | 2/2019 | Lee | G06F 1/1684 |
| 2019/0095672 A1* | 3/2019 | Yeke Yazdandoost | H01L 27/1462 |
| 2019/0138154 A1* | 5/2019 | Smith | B32B 17/06 |
| 2019/0311176 A1* | 10/2019 | Haddad | G06K 9/0004 |
| 2020/0089927 A1* | 3/2020 | Wu | H01L 27/3227 |
| 2020/0320267 A1* | 10/2020 | Zhang | G06V 10/147 |

FOREIGN PATENT DOCUMENTS

| | | | | |
|---|---|---|---|---|
| CN | 206497471 U | * | 9/2017 | ............ G06K 9/004 |
| CN | 107563318 A | | 1/2018 | |
| CN | 107832752 A | | 3/2018 | |
| CN | 107958145 A | | 4/2018 | |
| CN | 108351966 A | | 7/2018 | |

OTHER PUBLICATIONS

Communication Pursuant to Rule 164(1) EPC dated Apr. 7, 2022 corresponding to application No. EP19846539.5-1207.

* cited by examiner

FINGERPRINT IDENTIFICATION PANEL, FINGERPRINT IDENTIFICATION METHOD AND FINGERPRINT IDENTIFICATION DEVICE

CROSS-REFERENCE TO RELATED APPLICATIONS

This is a National Phase Application filed under 35 U.S.C. 371 as a national stage of PCT/CN2019/100035, filed on Aug. 9, 2019, an application claiming priority from Chinese patent application No. 201810909642.1 filed on Aug. 10, 2018, the entirety of which is hereby incorporated by reference.

TECHNICAL FIELD

The disclosure relates to the field of fingerprint identification technologies, and in particular, to a fingerprint identification panel, a fingerprint identification method, and a fingerprint identification device including the fingerprint identification panel.

BACKGROUND

In order to ensure security of electronic devices, a fingerprint identification function is provided in many electronic devices. For example, light sensing elements may be added to a display panel to provide the display panel with the fingerprint identification function.

A display panel having the fingerprint identification function generally includes light emitting elements and light sensing elements. In fingerprint identification, a finger is pressed on the display panel, the light emitted from the light emitting elements is irradiated on the fingerprint and is reflected to the light sensing elements by the fingerprint, and morphology of the fingerprint can be determined according to magnitudes of currents output by the light sensing elements.

SUMMARY

An aspect of the disclosure provides a fingerprint identification panel, including an encapsulation layer, a light emitting element, a light sensing element and a dielectric layer, wherein the light emitting element and the light sensing element are on a same side of the encapsulation layer, and the encapsulation layer is configured to enable light emitted from the light emitting element to be totally reflected in the encapsulation layer; the dielectric layer is between the encapsulation layer and the light sensing element and in direct contact with the encapsulation layer, and the dielectric layer is configured to enable light totally reflected by the encapsulation layer to be received by the light sensing element after passing through the dielectric layer, and a refractive index of the dielectric layer is smaller than a refractive index of the encapsulation layer.

According to an embodiment of the disclosure, the encapsulation layer has a refractive index between 1.5 and 1.7 and the dielectric layer has a refractive index between 1.3 and 1.4.

According to an embodiment of the disclosure, the fingerprint identification panel includes a plurality of light emitting elements, wherein the plurality of light emitting elements are positioned such that effective radiation ranges of light emitted from the plurality of light emitting elements on the light sensing element do not overlap with each other, the effective radiation range is defined by a first light and a second light emitted from the plurality of light emitting elements, an incident angle of the first light transmitted from the encapsulation layer toward air is equal to a critical angle at which total reflection occurs at an interface between the encapsulation layer and the air, and an incident angle of the second light transmitted from the encapsulation layer toward the dielectric layer is equal to a critical angle at which total reflection occurs at an interface between the encapsulation layer and the dielectric layer.

According to an embodiment of the disclosure, the plurality of light emitting elements are positioned such that the effective radiation ranges of light emitted from adjacent light emitting elements on the light sensing element is substantially externally-tangent.

According to an embodiment of the disclosure, the fingerprint identification panel includes a plurality of light sensing elements, wherein the dielectric layer includes a plurality of dielectric blocks, at least one dielectric block is on a side of each light sensing element close to the encapsulation layer, and the at least one dielectric block covers at least a portion of the light sensing element, such that light emitted from the light emitting elements is capable of forming the effective radiation ranges on the light sensing elements.

According to an embodiment of the disclosure, the light emitting element and the light sensing element are in a same layer, an orthographic projection of the light sensing element on the encapsulation layer is within an orthographic projection of the dielectric layer on the encapsulation layer, and an orthographic projection of the light emitting element on the encapsulation layer does not overlap with the orthographic projection of the dielectric layer on the encapsulation layer.

According to an embodiment of the disclosure, the light emitting element and the light sensing element are in different layers, the dielectric layer is between the light emitting element and the light sensing element, and an orthographic projection of the light emitting element on the encapsulation layer and an orthographic projection of the light sensing element on the encapsulation layer are both within an orthographic projection of the dielectric layer on the encapsulation layer.

According to an embodiment of the disclosure, the dielectric layer has a thickness ranging from 0.5 μm to 1 μm, and a portion of the encapsulation layer on a side of the dielectric layer away from the light sensing element has a thickness ranging from 1 μm to 2 μm.

According to an embodiment of the disclosure, the fingerprint identification panel includes a plurality of pixel units arranged in an array, wherein each pixel unit has the light emitting element therein, and the light sensing element is between two adjacent light emitting elements.

According to an embodiment of the disclosure, the fingerprint identification panel is an organic light emitting diode display panel, the light emitting elements include an organic light emitting diode emitting red light, an organic light emitting diode emitting green light, and an organic light emitting diode emitting blue light.

According to an embodiment of the disclosure, the light emitting element is a point light source According to an embodiment of the disclosure, the fingerprint identification panel further includes a driving circuit, the driving circuit including a light emitting control sub-circuit and an identification sub-circuit, wherein the light emitting control sub-circuit is configured to control the light emitting element within a target region of the fingerprint identification panel to emit light according to a fingerprint identification signal, and the identification sub-circuit is configured to determine a fingerprint morphology according to an electric signal generated by the light sensing element within the target region.

According to an embodiment of the disclosure, the light emitting control sub-circuit is further configured to control the light emitting element within the target region to emit light at a predetermined gray scale.

According to an embodiment of the disclosure, the fingerprint identification panel includes a fingerprint detection region, the light sensing element is in the fingerprint detection region, the dielectric layer is within the fingerprint detection region, and the target region includes the fingerprint detection region.

According to an embodiment of the disclosure, the driving circuit further includes a target region determination sub-circuit, the target region determination sub-circuit is configured to determine, as the target region, one of a region for displaying fingerprint identification prompt information and a region in which a change value of current output by the light sensing element within a predetermined period exceeds a predetermined value.

Another aspect of the disclosure provides a method of forming a fingerprint identification panel, the method includes forming an encapsulation layer, a light emitting element, a light sensing element and a dielectric layer, wherein the light emitting element and the light sensing element are formed on a same side of the encapsulation layer, the light sensing element is formed to receive light emitted from the light emitting element and totally reflected by the encapsulation layer, the dielectric layer is formed between the encapsulation layer and the light sensing element and is in direct contact with the encapsulation layer, to enable the totally reflected light to be received by the light sensing element after passing through the dielectric layer, and a refractive index of the dielectric layer is smaller than a refractive index of the encapsulation layer.

According to an embodiment of the disclosure, the fingerprint identification panel includes a plurality of light emitting elements, the plurality of light emitting elements are positioned such that effective radiation ranges of light emitted from the plurality of light emitting elements on the light sensing element do not overlap with each other, the effective radiation range is defined by a first light and a second light emitted from the plurality of light emitting elements, an incident angle of the first light transmitted from the encapsulation layer toward air is equal to a critical angle at which total reflection occurs at an interface between the encapsulation layer and the air, and an incident angle of the second light transmitted from the encapsulation layer toward the dielectric layer is equal to a critical angle at which total reflection occurs at an interface between the encapsulation layer and the dielectric layer.

Another aspect of the disclosure provides a fingerprint identification method using a fingerprint identification panel, wherein the fingerprint identification panel is the fingerprint identification panel described above, the method includes controlling, according to the fingerprint identification signal, a plurality of light emitting elements within the target region of the fingerprint identification panel to simultaneously emit light; and determining a fingerprint morphology according to current generated by the light sensing element within the target region.

According to an embodiment of the disclosure, the method further includes a step of determining the target region, the step of determining the target region includes determining, as the target region, one of a region in which fingerprint identification prompt information is displayed, and a region in which a change value of current output by the light sensing element within a predetermined period of time exceeds a predetermined value.

Another aspect of the disclosure provides a fingerprint identification device including a fingerprint identification panel, wherein the fingerprint identification panel is the fingerprint identification panel described above.

BRIEF DESCRIPTION OF THE DRAWINGS

The accompanying drawings serve to provide a further understanding of embodiments of the disclosure, constitute a part of the specification, and are used to explain the disclosure together with the following specific embodiments of the disclosure, without limiting the disclosure. In the accompanying drawings.

DETAILED DESCRIPTION

The embodiments of the disclosure will be described in detail below with reference to the accompanying drawings. It should be understood that the specific embodiments described herein are only used to illustrate and explain the disclosure and do not limit the disclosure.

Figure 1:
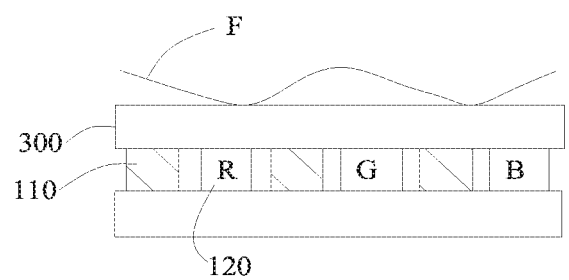
FIG. 1 is a schematic diagram of a display panel with a fingerprint identification function.
Figure 2:
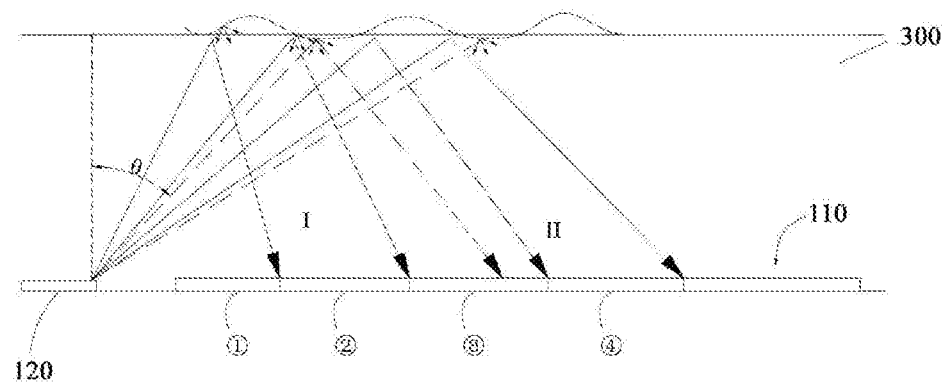
FIG. 2 is a schematic diagram of the fingerprint identification function in FIG. 1.
Figure 3:
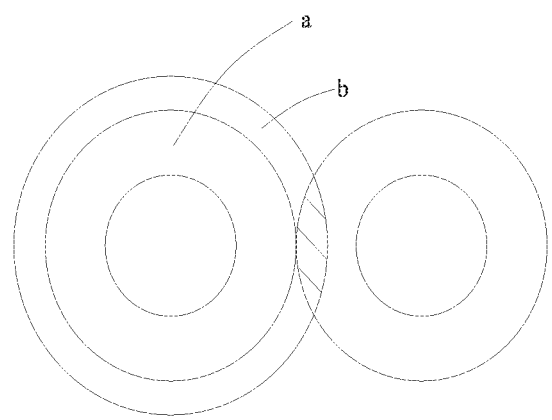
FIG. 3 is a schematic diagram of two adjacent light emitting elements interfering with each other.

FIG. 1 is a schematic diagram of a display panel with a fingerprint identification function, FIG. 2 is a schematic diagram of the fingerprint identification function in FIG. 1, and FIG. 3 is a schematic diagram of two adjacent light emitting elements interfering with each other.

As shown in FIG. 1, a display panel with a fingerprint identification function includes a plurality of pixel units, each of the pixel units has a light emitting element 120 (e.g., an organic light emitting diode) disposed therein, and light sensing elements 110 are each disposed between two adjacent light emitting elements 120. Since the light emitting elements 120 are point light sources, an effective radiation range of each light emitting element 120 on a fingerprint is annular, and an effective radiation range of light reflected by the fingerprint on a sensing surface is an enlargement of the effective radiation range of the light emitting element 120 on the fingerprint. Therefore, if a distance between two adjacent light emitting elements 120 is too small, light emitting regions of the two adjacent light emitting elements 120 interfere with each other. As shown in FIG. 3, a is an effective radiation range of light from one light emitting element that can be used to generate a fingerprint image, and b is an effective radiation range of light that cannot be used to generate a fingerprint image, and is also referred to as an interference region between two adjacent light sources.

As shown in FIG. 2, when no finger is pressed on an outer surface of an encapsulation layer 300, light emitted from the light emitting element 120 and having an incident angle smaller than a total reflection critical angle θ at an interface between the encapsulation layer 300 and air is mostly refracted outward through the outer surface of the encapsulation layer 300, and small part of the light is reflected toward the light sensing element 110, and light having an incident angle greater than or equal to the total reflection critical angle θ at the interface between the encapsulation layer 300 and the air is totally reflected back to the display panel and reaches a light sensing surface of the light sensing element 110. When a finger is pressed on the outer surface of the encapsulation layer 300, the light emitted from the light emitting element 120 and having an incident angle smaller than the total reflection critical angle θ is reflected by a portion of the outer surface of the encapsulation layer 300 covered by ridge portions and valley portions of a fingerprint, to form a pattern ①, a pattern ②, and a left portion of a pattern ③ on the light sensing surface, respectively, and the light emitted from the light emitting element 120 and having an incident angle exceeding the total reflection critical angle θ is reflected by the portion of the outer surface of the encapsulation layer 300 covered by the ridge portions and valley portions of the fingerprint, to form a right portion of the pattern ③ and a pattern ④ on the light sensing surface, respectively. The pattern ① and the pattern ③ are formed by the light reflected by a portion of the outer surface of the encapsulation layer 300 covered by the ridge portions of the fingerprint, and thus, the pattern ① and the pattern ③ are ridge-dark lines. The pattern ② and the pattern ④ are formed by the light reflected by a portion of the outer surface of the encapsulation layer 300 covered by the valley portions of the fingerprint. However, since the light for forming the pattern ② is the light with an incident angle smaller than the total reflection critical angle θ, that is, light in region I is the reflected light that is only 4% of the light emitted from the light emitting element 120, the pattern ② is a valley-dark line, and since the light for forming the pattern ④ is the light with an incident angle exceeding the total reflection critical angle θ, that is, light in region II is the total reflected light that is 100% of the light emitted from the light emitting element 120, the pattern ④ is a valley-bright line. In addition, since the left portion of the pattern ③ is formed by the light with an incident angle smaller than the total reflection critical angle θ, the pattern ①, the pattern ② and the left portion of the pattern ③ form a central ineffective region in which the fingerprint cannot be identified. Further, since the right portion of the pattern ③ is formed by the light with an incident angle exceeding the total reflection critical angle θ, the right portion of the pattern ③ and the pattern ④ form a fingerprint image region. Thus, an inner edge of the fingerprint image region is determined by the total reflection critical angle. Since the incident angle of light gradually increases and intensity of light gradually decreases in a direction from the inner edge of the fingerprint image region to an outer edge of the fingerprint image region, a boundary of the outer edge of the fingerprint image region is difficult to be determined. Therefore, in order to avoid mutual interference between adjacent point light sources, all the light emitting elements need to be turned on at different times in a time division manner in a fingerprint collection stage. However, after all the light emitting elements are turned on at different times in a time division manner, fingerprint images collected in different stages need to be spliced to obtain a complete fingerprint, which results in long time consumption in a fingerprint identification process.

Figure 4:
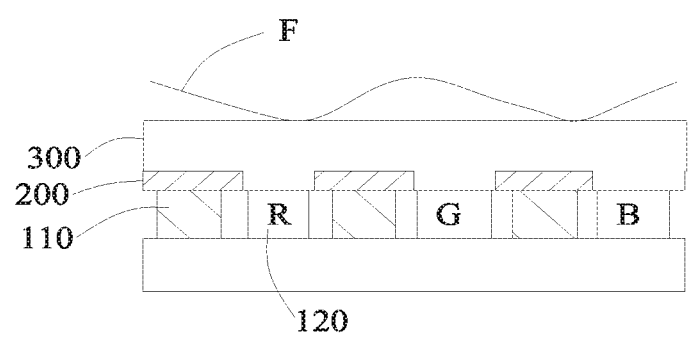
FIG. 4 is a schematic diagram of a fingerprint identification panel according to an embodiment of the disclosure.
Figure 5:
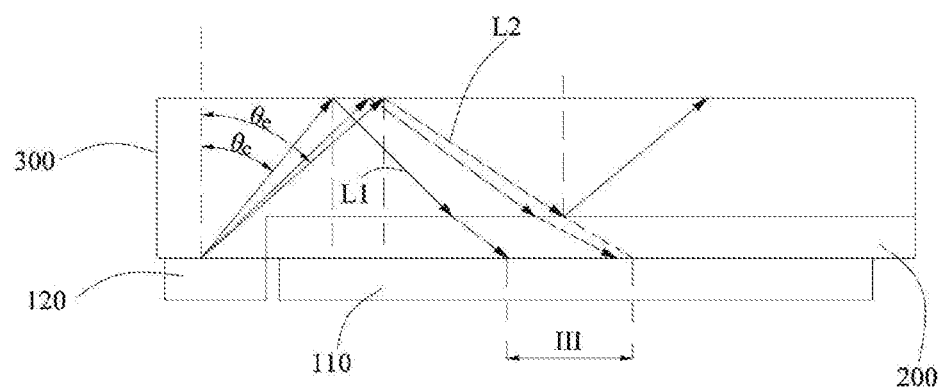
FIG. 5 is a schematic diagram of fingerprint identification by a fingerprint identification panel according to an embodiment of the disclosure.
Figure 6:
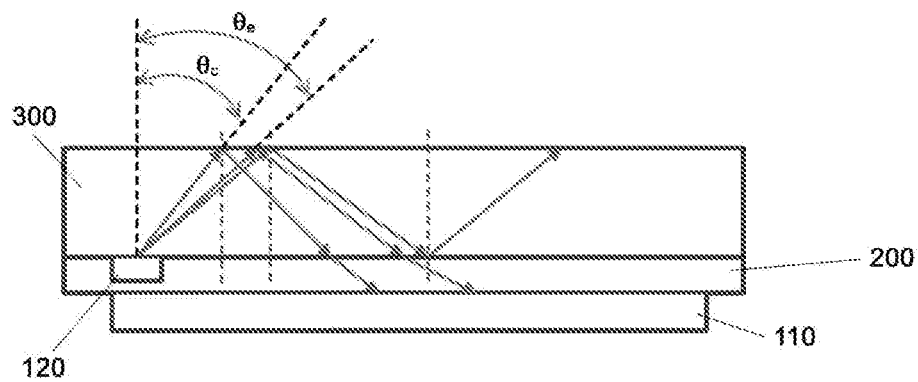
FIG. 6 is a schematic diagram of fingerprint identification by a fingerprint identification panel according to another embodiment of the disclosure.

FIG. 4 is a schematic diagram of a fingerprint identification panel according to an embodiment of the disclosure, FIG. 5 is a schematic diagram of fingerprint identification by a fingerprint identification panel according to an embodiment of the disclosure, and FIG. 6 is a schematic diagram of fingerprint identification by a fingerprint identification panel according to another embodiment of the disclosure.

As shown in FIG. 4, a fingerprint identification panel according to an embodiment of the disclosure includes an encapsulation layer 300, light emitting elements 120, light sensing elements 110, and a dielectric layer 200. The light emitting elements 120 and the light sensing elements 110 are on a same side of the encapsulation layer 300 and the encapsulation layer 300 directly contacts the dielectric layer 200, and the light sensing elements 110 are configured to receive light emitted from the light emitting elements 120 and totally reflected by the encapsulation layer 300. The dielectric layer 200 is between the encapsulation layer 300 and the light sensing elements 110, so that the totally reflected light is received by the light sensing elements 110 after passing through the dielectric layer 200, and a refractive index of the dielectric layer 200 is smaller than that of the encapsulation layer 300.

According to an embodiment of the disclosure, as shown in FIG. 5, the light emitting element 120 and the light sensing element 110 may be in a same layer, an orthogonal projection of the light sensing element 110 on the encapsulation layer 300 is within an orthogonal projection of the dielectric layer 200 on the encapsulation layer 300, and an orthogonal projection of the light emitting element 120 on the encapsulation layer 300 does not overlap with the orthogonal projection of the dielectric layer 200 on the encapsulation layer 300. For example, the light emitting element 120 and the light sensing element 110 may be spaced apart from each other by a certain distance in the same layer, or may be adjacent to each other in the same layer. However, the disclosure is not limited thereto, and as shown in FIG. 6, the dielectric layer 200 may be disposed between the light emitting element 120 and the light sensing element 110, and the orthographic projection of the light emitting element 120 on the encapsulation layer 300 and the orthographic projection of the light sensing element 110 on the encapsulation layer 300 are both within the orthographic projection of the dielectric layer 200 on the encapsulation layer 300. In addition, although FIG. 6 shows that the light emitting element 120 is in the dielectric layer 200, the embodiment is not limited thereto, and the light emitting element 120 may also be above the dielectric layer 200.

As shown in FIGS. 4 and 5, the light emitting element 120 emits light in the fingerprint identification performed by the fingerprint identification panel, and a description will be given below based on an assumption that, when transmitted from the encapsulation layer 300 to the air, light emitted from the light emitting element 120 has an incident angle greater than a first total reflection critical angle θc at which total reflection occurs when light is transmitted from the encapsulation layer 300 to the air. When a fingerprint F of a person to be identified covers an outer surface of the encapsulation layer 300, a part of light emitted from the light emitting element 120 is transmitted to a portion of the outer surface of the encapsulation layer 300 covered by valley portions in the fingerprint. Since the valley portions are not in contact with the encapsulation layer 300, the part of light is totally reflected by the portion of the encapsulation layer 300 covered by the valley portions towards the light sensing element 110. Other part of light emitted from the light emitting element 120 is transmitted to a portion of the outer surface of the encapsulation layer 300 covered by ridge portions in the fingerprint. Since the ridge portions are in contact with the encapsulation layer 300, a total reflection condition between the encapsulation layer 300 and the air is destroyed, therefore, the part of light is mostly absorbed or diffusely reflected by a contact surface of the encapsulation layer 300 with the ridge portions, and only a small portion of the part of light is reflected by the encapsulation layer 300 towards the light sensing element 110. Light reflected by the encapsulation layer 300 respectively passes through the encapsulation layer 300 and the dielectric layer 200 above the light sensing element 110 to reach the light sensing element 110. The light sensing element 110 generates a sensing signal according to intensity of received light, and a specific morphology of the fingerprint may be determined based on the sensing signal generated by the light sensing element 110. For convenience of description, a region of the light sensing element 110 that receives totally reflected light is referred to as a fingerprint sensing region (i.e., an effective radiation range of the light emitting element 120 on the light sensing element 110), and a position of the fingerprint sensing region III is shown in FIG. 5.

The fingerprint identification panel has two optical interfaces including the interface between the encapsulation layer 300 and the air and an interface between the encapsulation layer 300 and the dielectric layer 200. Therefore, a boundary of the fingerprint sensing region III is defined by light with an incident angle equal to a first total reflection critical angle θc at the interface between the encapsulation layer 300 and the air and light with an incident angle equal to a second total reflection critical angle θe at the interface between the encapsulation layer 300 and the dielectric layer 200.

As shown in FIG. 5, light with an incident angle greater than or equal to the first total reflection critical angle θc may be totally reflected at the interface between the encapsulation layer 300 and the air, the reflected light is L1, and conversely, light with an incident angle less than the first total reflection critical angle θc mostly exits from the encapsulation layer 300 by refraction. In addition, light with an incident angle exceeding the second total reflection critical angle θe is totally reflected at the interface between the encapsulation layer 300 and the air, the reflected light is L2, the reflected light L2 is totally reflected at the interface between the encapsulation layer 300 and the dielectric layer 200 upon reaching the interface between the encapsulation layer 300 and the dielectric layer 200, and does not reach the light sensing surface of the light sensing element 100, and on the other hand, light with an incident angle greater than or equal to the first total reflection critical angle θc and less than the second total reflection critical angle θe is totally reflected at the interface between the encapsulation layer 300 and the air, and the reflected light is refracted to the light sensing surface of the light sensing element 100 through the dielectric layer 200 upon reaching the interface between the encapsulation layer 300 and the dielectric layer 200.

Therefore, light with an incident angle between the first total reflection critical angle θc and the second total reflection critical angle θe may reach the light sensing surface of the light sensing element 110, light with an incident angle equal to the first total reflection critical angle θc and light with an incident angle equal to the second total reflection critical angle θe define the boundary of the fingerprint sensing region III, and light with an incident angle outside a range between the first total reflection critical angle θc and the second total reflection critical angle θe rarely reaches the light sensing element 110. In fingerprint identification, the fingerprint F covers the surface of the encapsulation layer 300, and the total reflection condition at the interface between the encapsulation layer 300 and the air is destroyed, so that light between the light L1 which is totally reflected at the interface between the encapsulation layer 300 and the air and the light L2 which is totally reflected at the interface between the encapsulation layer 300 and the dielectric layer 200 can reach the light sensing surface of the light sensing element 110 after being reflected by the encapsulation layer 300, and the morphology of the fingerprint may be determined according to induced current generated by the light sensing element 110 at the fingerprint sensing region III.

Although FIG. 5 shows that the light emitting element 120 is in direct contact with the encapsulation layer 300, the present embodiment is not limited thereto, and other layer, such as a light extraction layer, a water and oxygen adsorption layer, or the like, may also be present between the light emitting element 120 and the encapsulation layer 300.

In the fingerprint identification panel according to an embodiment of the disclosure, both an area and a position of the fingerprint sensing region III are decided. By adjusting thickness of the encapsulation layer 300 and thickness of the dielectric layer 200, the position and the area of the fingerprint sensing region III may be adjusted.

According to an embodiment of the disclosure, the effective radiation ranges of adjacent light emitting elements on the light sensing element may not overlap with each other by setting positions of the respective light emitting elements 120. As such, in fingerprint identification, a plurality of (even all) light emitting elements 120 can be driven to emit light at the same time, and a clear fingerprint edge can be obtained. The fingerprint identification panel according to an embodiment of the disclosure can have an improved efficiency of fingerprint identification, and an improved precision of fingerprint identification.

Although FIGS. 5 and 6 show that the orthographic projection of the light sensing element 110 on the encapsulation layer 300 is within the orthographic projection of the dielectric layer 200 on the encapsulation layer 300, embodiments of the disclosure are not limited thereto, and the dielectric layer 200 may cover only a portion of the light sensing element 110, as long as light emitted from the light emitting element 120 can form an effective radiation range on the light sensing element 110.

Figure 7:
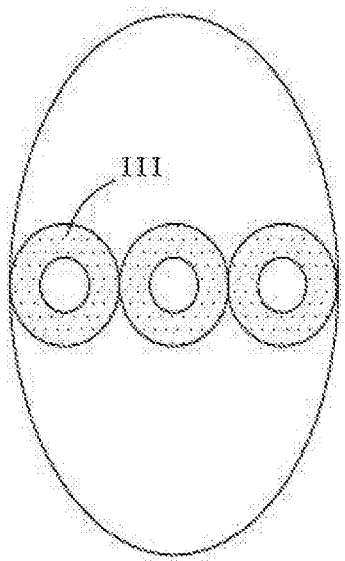
FIG. 7 is a schematic diagram of arrangement of light emitting elements according to an embodiment of the disclosure.

FIG. 7 is a schematic diagram of an effective radiation range of a light emitting element according to an embodiment of the disclosure.

In some embodiments, as shown in FIG. 7, the light emitting elements 120 may be positioned such that edges of the effective radiation ranges (i.e., the fingerprint sensing regions III) of adjacent light emitting elements 120 on the light sensing element 110 are substantially tangent (externally-tangent), thereby reducing distances between the light emitting elements 120 and increasing an effective area of the fingerprint image. In this way, a greater number of light emitting elements can be driven to emit light at the same time, and time required for fingerprint identification can be shortened. For example, when the effective radiation ranges of adjacent light emitting elements 120 on the light sensing element 110 overlap with each other by a degree, for example, within 5% of the effective radiation range, the effective radiation ranges of the adjacent light emitting elements 120 on the light sensing element 110 may be considered to be substantially externally-tangent.

According to the embodiment of the disclosure, although FIG. 5 illustrates only one light emitting element 120 and a fingerprint sensing region III corresponding to the light emitting element 120, in the fingerprint identification panel, a light emitting element adjacent to the light emitting element 120 may also form a fingerprint sensing region on the light sensing element 110, and the fingerprint sensing region of the adjacent light emitting element on the light sensing element 110 may be at the left or right side of the fingerprint sensing region III shown in FIG. 5 and substantially externally-tangent to the fingerprint sensing region III according to thickness of the encapsulation layer 300 and thickness of the dielectric layer 200.

According to an embodiment of the disclosure, a refractive index of the encapsulation layer 300 is between 1.5 and 1.7. A refractive index of the dielectric layer 200 is between 1.3 and 1.4.

According to an embodiment of the disclosure, the light sensing element 110 includes a PIN junction. The disclosure is not limited thereto and the light sensing element 110 may further include other photosensitive materials as needed.

It is understood that the encapsulation layer 300 may be of a single layer, or may be formed by combining multiple different optical film layers, with each optical film layer having a refractive index between 1.5 and 1.7.

According to an embodiment of the disclosure, the thickness of the dielectric layer 200 is between 0.5 μm and 1 μm, and the thickness of a portion of the encapsulation layer 300 on a side of the dielectric layer away from the light sensing element 110 is between 1 μm and 2 μm.

In the disclosure, specific structure and the specific function of the fingerprint identification panel are not particularly limited. For example, the fingerprint identification panel may be used for fingerprint identification only. The disclosure is not limited thereto. For example, the fingerprint identification panel may also have a display function. In this case, the fingerprint identification panel includes a plurality of pixel units arranged in an array, each of the pixel units having a light emitting element provided therein for display. The light emitted from the light emitting elements may be used for fingerprint identification as well as displaying. This fingerprint identification panel is a display panel capable of realizing embedded fingerprint identification.

According to an embodiment of the disclosure, the light emitting element is an organic light emitting diode (OLED). According to an embodiment of the disclosure, the fingerprint identification panel may include a plurality of light emitting elements 120 of different colors to realize color display. According to an embodiment of the disclosure, the fingerprint identification panel is an OLED display panel.

For example, in the fingerprint identification panel shown in FIG. 4, the light emitting elements 120 may include an organic light emitting diode emitting red light (R), an organic light emitting diode emitting green light (G), and an organic light emitting diode emitting blue light (B).

Figure 10:
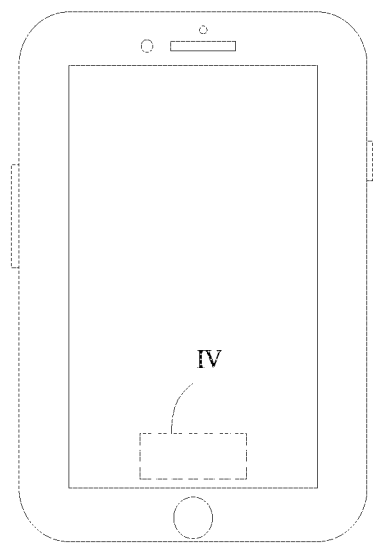
FIG. 10 is a schematic diagram showing a position of a fingerprint detection region on a fingerprint identification panel according to an embodiment of the disclosure.

When the fingerprint identification panel is used as a display panel, the light sensing elements 110 may be disposed between any two adjacent light emitting elements 120 throughout the fingerprint identification panel. The disclosure is not limited thereto, and the light sensing elements 110 may be disposed only in a partial region of the fingerprint identification panel in order to secure a display effect. For example, as shown in FIG. 10, a partial region of the fingerprint identification panel may be used as a fingerprint detection region IV, and accordingly, the light sensing elements 110 are disposed in the fingerprint detection region IV of the fingerprint identification panel, and the dielectric layer 200 is also in the fingerprint detection region IV of the fingerprint identification panel. The light sensing elements 110 and the dielectric layer 200 are not disposed in portions other than the fingerprint detection region IV, so that overall cost of the fingerprint identification panel may be saved.

FIG. 10 shows that the fingerprint detection region IV is at a lower part of the fingerprint identification panel, however the disclosure is not limited thereto, and the fingerprint detection region IV may be positioned at other positions of the fingerprint identification panel.

According to an embodiment of the present disclosure, the dielectric layer 200 may include a plurality of dielectric blocks, as shown in FIG. 4, at least one dielectric block covers each of the light sensing elements 110. The dielectric block may completely cover the light sensing element, that is, the orthographic projection of the light sensing element 110 on the encapsulation layer 300 is within the orthographic projection of the dielectric block on the encapsulation layer 300, or the dielectric block may cover only a portion of the light sensing element to enable the light emitted from the light emitting element 120 to form an effective radiation range on the light sensing element 110. According to an embodiment of the disclosure, the fingerprint identification panel further includes a driving circuit.

Figure 9:
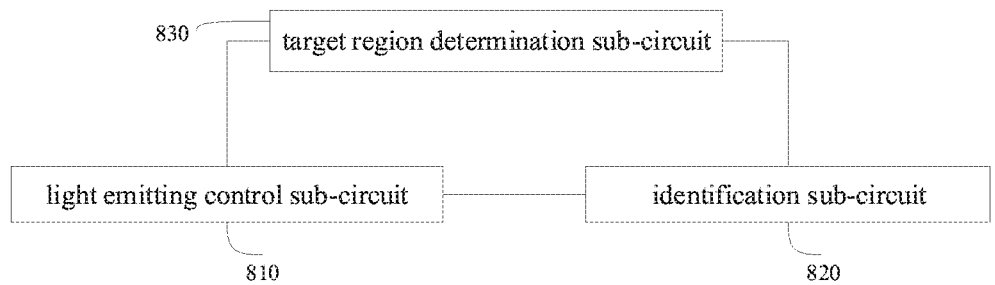
FIG. 9 is a block diagram of a driving circuit according to an embodiment of the disclosure.

FIG. 9 is a block diagram of a driving circuit according to an embodiment of the disclosure.

As shown in FIG. 9, the driving circuit includes a light emitting control sub-circuit 810 and an identification sub-circuit 820.

The light emitting control sub-circuit 810 is configured to control light emitting elements in a target region of the fingerprint identification panel to emit light according to a fingerprint identification signal, and the identification sub-circuit 820 is configured to determine fingerprint morphology according to current generated by light sensing elements in the target region.

In the disclosure, the number of the light emitting elements that emit light in fingerprint identification is not particularly limited as long as the morphology of the fingerprint can be identified.

According to an embodiment of the disclosure, the light emitting control sub-circuit 810 is configured to control all light emitting elements within the target region to emit light at a same time, thereby improving an efficiency of fingerprint identification.

In the disclosure, how to determine the target region is not particularly limited. For example, when the fingerprint identification panel includes a fingerprint detection region, the target region is the fingerprint detection region.

In the disclosure, a position of the target region is not particularly limited. For example, an entire light exiting surface of the fingerprint identification panel may be formed as the target region.

According to an embodiment of the disclosure, when the fingerprint identification panel includes the fingerprint detection region, the target region includes the fingerprint detection region. The fingerprint may be identified by pressing the fingerprint at any position of the light emitting surface of the fingerprint detection region.

As shown in FIG. 9, the driving circuit further includes a target region determination sub-circuit 830.

The target region determination sub-circuit 830 is configured to determine, as the target region, a region where the fingerprint identification prompt information is displayed.

Figure 11:
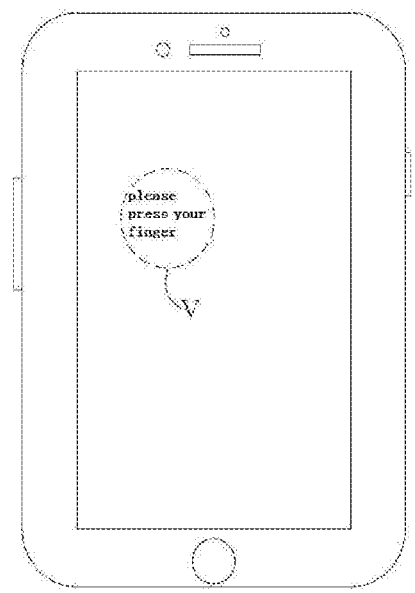
FIG. 11 is a schematic diagram showing fingerprint identification prompt information on a fingerprint identification panel according to an embodiment of the disclosure.

For example, the fingerprint identification panel may be used to display an image. The fingerprint identification panel may display the fingerprint identification prompt information. For example, as shown in FIG. 11, the fingerprint identification prompt information includes "please press your finger" in a region V. The target region determination sub-circuit 830 may determine the region V in which the fingerprint identification prompt information is displayed as the target region.

According to an embodiment of the disclosure, the target region determination sub-circuit 830 is configured to determine, as the target region, a region corresponding to a light sensing element by which a change value of a current output within a predetermined period exceeds a predetermined value.

For example, when a finger is pressed on a light exiting surface of the fingerprint identification panel, brightness of the pressed region is sharply reduced, and accordingly, induced current generated by the light sensing elements in the pressed region is greatly changed. Thus, the target region determination sub-circuit 830 may determine the region as the target region.

As described above, since the driving circuit can control all the light emitting elements in the target region to emit light at a same time, the efficiency of fingerprint identification can be improved. In the fingerprint identification panel, the light emitted from the light emitting elements may not interfere with each other, so that a fingerprint image with clear boundaries can be obtained through the light sensing elements, and precision of the fingerprint identification can be improved.

In fingerprint identification, since the fingerprint covers the target region, a viewer cannot see what is displayed in the target region covered by the fingerprint, and in order to improve identification precision, the light emitting control sub-circuit 810 controls the light emitting elements in the target region to emit light at a predetermined gray scale. Since each light emitting element can emit light with a higher luminance, stronger light can be reflected to the light sensing elements, thus improving the identification precision.

Figure 8:
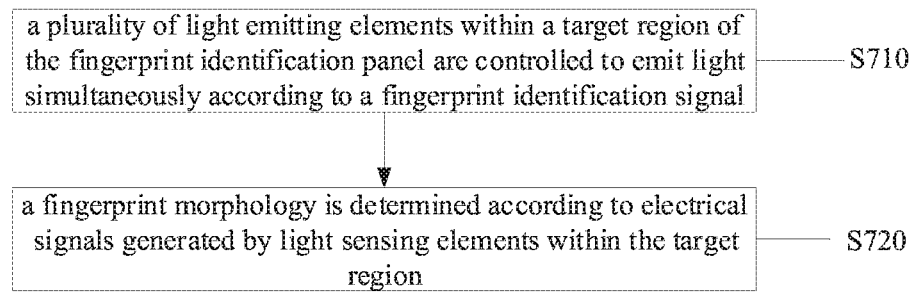
FIG. 8 is a flow chart of a fingerprint identification method according to an embodiment of the disclosure.

FIG. 8 is a flow chart of a fingerprint identification method according to an embodiment of the disclosure.

The fingerprint identification method according to an embodiment of the disclosure identifies a fingerprint by using the fingerprint identification panel as described above, and as shown in FIG. 8, the fingerprint identification method includes steps S710 and S720.

In step S710, a plurality of light emitting elements within a target region of the fingerprint identification panel are controlled to emit light simultaneously according to a fingerprint identification signal.

In step S720, a fingerprint morphology is determined according to electrical signals (e.g., current) generated by the light sensing elements within the target region.

According to an embodiment of the disclosure, controlling all the light emitting elements within the target region to emit light simultaneously can improve light emitting efficiency of a display panel.

The driving circuit may perform the method, e.g. the light emitting control sub-circuit 810 is configured to perform step S710 and the identification sub-circuit 820 is configured to perform step S720.

In fingerprint identification, since the fingerprint covers the target region, a viewer cannot see content displayed in the target region covered by the fingerprint, and in order to improve identification precision, in step S710, the light emitting elements within the target region are controlled to emit light at a predetermined gray scale.

As mentioned hereinbefore, the fingerprint identification panel may include a fingerprint detection region, the light sensing elements are disposed in the fingerprint detection region of the fingerprint identification panel, the dielectric layer is also disposed in the fingerprint detection region of the fingerprint identification panel, and the target region correspondingly includes the fingerprint detection region.

According to an embodiment of the disclosure, the fingerprint identification method further includes a step of determining a target region, the step of determining the target region includes determining a region in which fingerprint identification prompt information is displayed as the target region; or determining a region of the fingerprint identification panel corresponding to the light sensing elements by which a change value of current output within a predetermined period exceeds a predetermined value as the target region.

In the fingerprint identification panel provided in the disclosure, the target region determination sub-circuit 830 may perform the above-described step of determining the target region.

In another aspect, the disclosure also provides a method of forming the above fingerprint identification panel. The method includes the step of forming an encapsulation layer, light emitting elements, light sensing elements and a dielectric layer, the encapsulation layer is formed on the same side of the light emitting elements and the light sensing element and contacting with the dielectric layer directly, the light sensing elements are formed to receive light emitted from the light emitting elements and totally reflected by the encapsulation layer, and the dielectric layer is formed between the encapsulation layer and the light sensing elements, so that the totally reflected light is received by the light sensing elements after passing through the dielectric layer, and a refractive index of the dielectric layer is smaller than that of the encapsulation layer.

In another aspect, the disclosure also provides a fingerprint identification device, which may include a fingerprint identification panel as described above.

In the disclosure, a specific structure of the fingerprint identification device is not particularly limited, and the fingerprint identification device may be any electronic device such as an attendance checking device or a display device.

The fingerprint identification panel according to an embodiment of the disclosure can obtain clearer fingerprint edges by making an effective radiation range (i.e., the fingerprint sensing region) of each light emitting element on the light sensing elements have a clear boundary, and thus, both the efficiency of fingerprint identification and the precision of fingerprint identification can be improved. Further, the fingerprint identification panel according to an embodiment of the disclosure can increase utilization area of the light sensing elements by making the effective radiation ranges of the light emitting elements on the light sensing elements not overlap with each other, so that a greater number (even all) of light emitting elements can be driven at a same time, and the time required for fingerprint identification can be shorten.

It will be understood that the above embodiments are merely exemplary embodiments employed to illustrate principles of the disclosure, and the disclosure is not limited thereto. It will be apparent to those skilled in the art that various changes and modifications can be made without departing from spirit and scope of the disclosure, and these changes and modifications are to be considered within the scope of the disclosure.

The invention claimed is:

1. A fingerprint identification panel comprising an encapsulation layer, a plurality of light emitting elements, a light sensing element, a dielectric layer, and a plurality of pixel units arranged in an array, and
wherein the light emitting elements and the light sensing element are on a same side of the encapsulation layer, and the encapsulation layer is configured to enable light emitted from the light emitting elements to be totally reflected in the encapsulation layer; the dielectric layer is between the encapsulation layer and the light sensing element and in direct contact with the encapsulation layer and the light sensing element, and the dielectric layer is configured to enable light totally reflected by the encapsulation layer to be received by the light sensing element after passing through the dielectric layer, and
a refractive index of the dielectric layer is smaller than a refractive index of the encapsulation layer,
wherein the plurality of light emitting elements are positioned such that effective radiation ranges of light emitted from the plurality of light emitting elements on the same light sensing element do not overlap with each other, the effective radiation range is defined by a first light and a second light emitted from the plurality of light emitting elements, an incident angle of the first light transmitted from the encapsulation layer toward air is equal to a critical angle at which total reflection occurs at an interface between the encapsulation layer and the air, and an incident angle of the second light transmitted from the encapsulation layer toward the dielectric layer is equal to a critical angle at which total reflection occurs at an interface between the encapsulation layer and the dielectric layer,
the encapsulation layer has a refractive index between 1.5 and 1.7 and the dielectric layer has a refractive index between 1.3 and 1.4, and
each pixel unit has the light emitting element therein, and the light sensing element is between any two adjacent light emitting elements.

2. The fingerprint identification panel of claim 1, wherein the plurality of light emitting elements are positioned such that the effective radiation ranges of light emitted from adjacent light emitting elements on the light sensing element is substantially externally-tangent.

3. The fingerprint identification panel of claim 1, comprising a plurality of light sensing elements, wherein the dielectric layer comprises a plurality of dielectric blocks, at least one dielectric block is on a side of each light sensing element close to the encapsulation layer, and the at least one dielectric block covers at least a portion of the light sensing element, such that light emitted from the light emitting elements is capable of forming the effective radiation ranges on the light sensing element.

4. The fingerprint identification panel of claim 1, wherein the light emitting element and the light sensing element are in a same layer, an orthographic projection of the light sensing element on the encapsulation layer is within an orthographic projection of the dielectric layer on the encapsulation layer, and an orthographic projection of the light emitting element on the encapsulation layer does not overlap with the orthographic projection of the dielectric layer on the encapsulation layer.

5. The fingerprint identification panel of claim 1, wherein the dielectric layer has a thickness ranging from 0.5 μm to 1 μm, and a portion of the encapsulation layer on a side of the dielectric layer away from the light sensing element has a thickness ranging from 1 μm to 2 μm.

6. The fingerprint identification panel of claim 1, wherein the fingerprint identification panel is an organic light emitting diode display panel,
the light emitting elements comprise an organic light emitting diode emitting red light, an organic light emitting diode emitting green light, and an organic light emitting diode emitting blue light.

7. The fingerprint identification panel of claim 1, wherein the light emitting element is a point light source.

8. The fingerprint identification panel of claim 1, further comprising a driving circuit, the driving circuit comprising a light emitting control sub-circuit and an identification sub-circuit,
wherein the light emitting control sub-circuit is configured to control the light emitting element within a target region of the fingerprint identification panel to emit light according to a fingerprint identification signal, and the identification sub-circuit is configured to determine a fingerprint morphology according to an electric signal generated by the light sensing element within the target region.

9. The fingerprint identification panel of claim 8, wherein the light emitting control sub-circuit is further configured to control the light emitting element within the target region to emit light at a predetermined gray scale.

10. The fingerprint identification panel of claim 8, wherein the fingerprint identification panel comprises a fingerprint detection region, the light sensing element is in the fingerprint detection region, the dielectric layer is within the fingerprint detection region, and the target region comprises the fingerprint detection region.

11. The fingerprint identification panel of claim 8, wherein the driving circuit further comprises a target region determination sub-circuit,
the target region determination sub-circuit is configured to determine, as the target region, one of a region for displaying fingerprint identification prompt information and a region in which a change value of current output by the light sensing element within a predetermined period exceeds a predetermined value.

12. A fingerprint identification method using a fingerprint identification panel, wherein the fingerprint identification panel is the fingerprint identification panel of claim 8, the method comprising:
controlling, according to the fingerprint identification signal, a plurality of light emitting elements within the target region of the fingerprint identification panel to simultaneously emit light; and
determining a fingerprint morphology according to current generated by the light sensing element within the target region.

13. The method of claim 12, further comprising a step of determining the target region, the step of determining the target region comprising:

determining, as the target region, one of a region in which fingerprint identification prompt information is displayed, and a region in which a change value of current output by the light sensing element within a predetermined period exceeds a predetermined value.

14. A fingerprint identification device comprising a fingerprint identification panel, wherein the fingerprint identification panel is the fingerprint identification panel of claim 1.

15. A method of forming a fingerprint identification panel, comprising:
forming an encapsulation layer, a plurality of light emitting elements, a light sensing element, a dielectric layer, and a plurality of pixel units arranged in an array,
wherein the light emitting elements and the light sensing element are formed on a same side of the encapsulation layer,
the light sensing element is formed to receive light emitted from the light emitting elements and totally reflected by the encapsulation layer,
the dielectric layer is formed between the encapsulation layer and the light sensing element and is in direct contact with the encapsulation layer and the light sensing element, to enable the totally reflected light to be received by the light sensing element after passing through the dielectric layer, and
a refractive index of the dielectric layer is smaller than a refractive index of the encapsulation layer,
wherein the plurality of light emitting elements are positioned such that effective radiation ranges of light emitted from the plurality of light emitting elements on the same light sensing element do not overlap with each other, the effective radiation range is defined by a first light and a second light emitted from the plurality of light emitting elements, an incident angle of the first light transmitted from the encapsulation layer toward air is equal to a critical angle at which total reflection occurs at an interface between the encapsulation layer and the air, and an incident angle of the second light transmitted from the encapsulation layer toward the dielectric layer is equal to a critical angle at which total reflection occurs at an interface between the encapsulation layer and the dielectric layer,
the encapsulation layer has a refractive index between 1.5 and 1.7 and the dielectric layer has a refractive index between 1.3 and 1.4, and
each pixel unit has the light emitting element therein, and the light sensing element is between any two adjacent light emitting elements.

* * * * *